(12) United States Patent
Mun

(10) Patent No.: US 8,927,880 B2
(45) Date of Patent: Jan. 6, 2015

(54) PRINTED CIRCUIT BOARD AND METHOD FOR MANUFACTURING THE SAME

(71) Applicant: Samsung Electro-Mechanics Co., Ltd., Gyeonggi-do (KR)

(72) Inventor: Kyung Don Mun, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/842,216

(22) Filed: Mar. 15, 2013

(65) Prior Publication Data

US 2014/0151897 A1    Jun. 5, 2014

(30) Foreign Application Priority Data

Dec. 4, 2012    (KR) .................. 10-2012-0139729

(51) Int. Cl.
*H05K 1/11* (2006.01)
*H01L 23/48* (2006.01)
*H01L 23/00* (2006.01)

(52) U.S. Cl.
CPC .............. *H01L 23/481* (2013.01); *H01L 24/03* (2013.01)
USPC ........... 174/266; 257/774; 174/250; 174/251; 174/259

(58) Field of Classification Search
CPC ............ H05K 2201/0959; H05K 2201/09563; H05K 2201/0355; H05K 3/42; H05K 3/423; H05K 3/427
USPC .................. 257/774; 174/250, 251, 259, 266
See application file for complete search history.

(56) References Cited

U.S. PATENT DOCUMENTS

| 5,473,120 A * | 12/1995 | Ito et al. ......................... 174/264 |
| 2006/0289203 A1 * | 12/2006 | Oda ............................... 174/264 |
| 2009/0008145 A1 * | 1/2009 | Chen et al. ..................... 174/264 |

FOREIGN PATENT DOCUMENTS

| KR | 10-2012-0026849 A | 3/2012 |
| KR | 10-2012-0037306 A | 4/2012 |

\* cited by examiner

*Primary Examiner* — David Vu
*Assistant Examiner* — Brandon Fox
(74) *Attorney, Agent, or Firm* — Bracewell & Giuliani LLP; Brad Y. Chin

(57) ABSTRACT

Disclosed herein are a printed circuit board, including an insulating layer; a circuit wiring formed on one surface or both surfaces of the insulating layer and made of a single metal layer; a via formed in the insulating layer for interconnecting the circuit wirings through the insulating layer; and a pad layer formed on one surface or both surfaces of the insulating layer and adhered to an end portion of the via, the pad layer being formed of a central portion extended from the via and an outside portion made of the same single metal layer as the circuit wiring, and a method for manufacturing the same.

8 Claims, 3 Drawing Sheets

PRINTED CIRCUIT BOARD AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2012-0139729, entitled "Printed Circuit Board and Method for Manufacturing the Same" filed on Dec. 4, 2012, which is hereby incorporated by reference in its entirety into this application.

BACKGROUND OF THE INVENTION

1. Technical Field

The present invention relates to a printed circuit board and a method for manufacturing the same, and more particularly, to a printed circuit board having a circuit wiring configured of a single metal layer and a method for manufacturing the same.

2. Description of the Related Art

A circuit wiring formed according to a method for manufacturing a printed circuit board is configured of several metal layers such as a copper foil layer of a copper clad laminate, a seed layer formed by a chemical plating, and an electrolysis plating layer formed by electrolysis plating using the seed layer as a leading wire, such that a thickness thereof is thick. As a result, a demand for complexity and an increase in density of a circuit, thinness of the board, and the like, which are recently demanded is not satisfied.

In the case of using a copper clad laminate having a thin copper foil layer in order to decrease the thickness of the circuit wiring as described above, generally, as the copper foil layer of the copper clad laminate is thinner, the cost thereof is expensive, such that a manufacturing cost is increased. In addition, the copper clad laminate having the thin copper foil layer has low thin plate driving force, such that productivity thereof is decreased.

In relation to this, a printed circuit board disclosed in Korean Patent Laid-Open Publication No. 10-2012-0026849 (hereinafter, referred to as a related art document) will be described. In this related art document, an electronic element is inserted into an opening part of the printed circuit board and a circuit wiring of the printed circuit board and the electronic element are electrically conducted through a circuit pattern formed on a sidewall of the opening part, such that a thickness of the printed circuit board is decreased by a thickness of the electronic element.

According to this configuration, the thickness of the printed circuit board can be somewhat decreased, but this configuration does not basically solve the problem of the thickness of the circuit wiring. As a result, an effect of this configuration cannot but become small in a multi-layer printed circuit board in which a number of circuit wirings are laminated. In addition, referring to claim 7 of the related art document, a method for manufacturing the printed circuit board is complicated, such that productivity may be decreased.

RELATED ART DOCUMENT

Patent Document (Patent Document 1) Patent Document: Korean Patent Laid-Open Publication No. 10-2012-0026849

SUMMARY OF THE INVENTION

An object of the present invention is to provide a printed circuit board having a circuit wiring configured of a single metal layer capable of satisfying all demands for complexity and an increase in density of a circuit, thinness of the board, and the like, which are recently demanded while increasing productivity, and a method for manufacturing the same.

According to an exemplary embodiment of the present invention, there is provided a printed circuit board, including: an insulating layer; a circuit wiring formed on one surface or both surfaces of the insulating layer and made of a single metal layer; a via formed in the insulating layer for interconnecting the circuit wirings through the insulating layer; and a pad layer formed on one surface or both surfaces of the insulating layer and adhered to an end portion of the via, wherein the pad layer is formed of a central portion extended from the via and an outside portion made of the same single metal layer as the circuit wiring.

The printed circuit board may further include a seed layer formed a sidewall of the via.

The circuit wiring may have a thickness of 2 µm to 12 µm.

A height of the central portion of the pad layer may be the same as that of the outside portion of the pad layer.

According to another exemplary embodiment of the present invention, there is provided a method for manufacturing a printed circuit board, the method including: (a) preparing an insulating layer having a single metal layer adhered to one surface or both surfaces thereof; (b) processing a via hole in the insulating layer; (c) forming a plating layer in the via hole as well as on a surface of the single metal layer; (d) polishing an upper surface of the single metal layer at a predetermined thickness so as to expose the surface of the single metal layer; and (e) selectively etching the single metal layer to form a circuit wiring and a pad layer.

Step (d) may be achieved by a chemical mechanical polishing (CMP) method.

Step (c) may be achieved by forming a seed layer in the via hole as well as on the surface of the single metal layer and then performing an electrolysis plating using the seed layer as a leading wire.

The seed layer beneath the polished plating layer may be removed together with the plating layer at the time of performing step (d).

The seed layer may be removed by flash etching or soft etching.

Step (e) may include: adhering a dry film on the surface of the single metal layer exposed to the outside; forming an opening part in a predetermined position of the dry film; etching a portion exposed through the opening part in the single metal layer; and delaminating the dry film.

DESCRIPTION OF THE PREFERRED EMBODIMENTS

Figure 1:
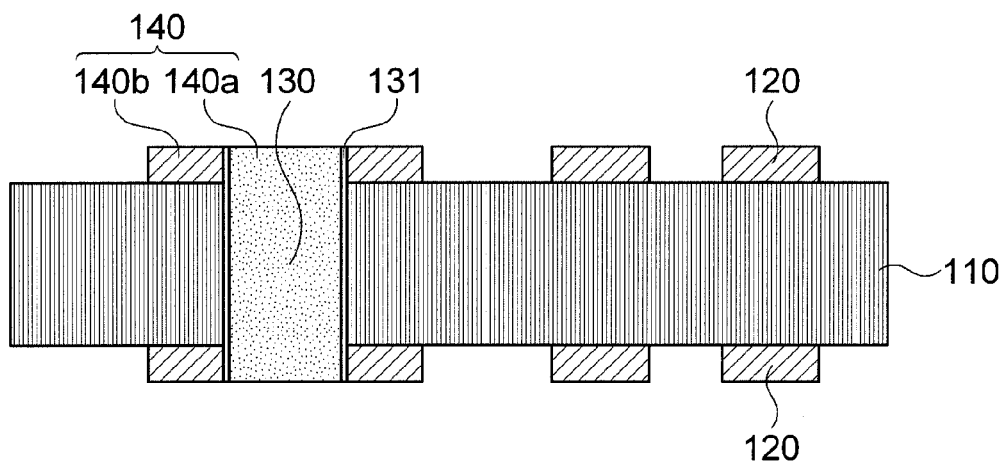
FIG. 1 is a cross-sectional view of a printed circuit board according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

FIG. 1 is a cross-sectional view of a printed circuit board according to an exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention.

FIG. 1 is a cross-sectional view of a printed circuit board according to an exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention.

Referring to FIG. 1, a printed circuit board 100 according to an exemplary embodiment of the present invention may include an insulating layer 110, a circuit wiring 120 formed on one surface or both surfaces of the insulating layer 110, a via 130 formed in the insulating layer 110, and a pad layer 140 formed on one surface or both surfaces of the insulating layer 110 and adhered to an end portion of the via 130.

Although the printed circuit board having the circuit wirings 120 formed on both surfaces of one insulating layer 110, that is, having two-layer circuit wirings has been shown in FIG. 1, the printed circuit board according to the exemplary embodiment of the present invention may be a multi-layer printed circuit board (for example, having three layers or more) in which the insulating layer covering the circuit wirings 120 and a circuit wiring formed on the insulating layer are repeatedly formed through a buildup process.

Specifically, the insulating layer 110 may be a thermosetting or thermo-plastic polymer substrate, a ceramic substrate, an organic-inorganic complex material substrate, or a glass fiber impregnated substrate and may include an epoxy based insulating resin in the case of including a polymer resin. Unlike this, the insulating layer 110 may include a polyimide based resin.

In the exemplary embodiment of the present invention, the circuit wiring 120 formed on one surface or both surfaces of the above-mentioned insulating layer 110 is configured of a single metal layer. That is, in the printed circuit board 100 according to the exemplary embodiment of the present invention, the circuit wiring 120 is configured of one metal layer unlike the related art.

Here, configuration material of the single metal layer configuring the circuit wiring 120 is not particularly limited as long as it has excellent conductivity, and may be selected from a group consisting of copper (Cu), aluminum (Al), silver (Ag), palladium (Pd), nickel (Ni), chromium (Cr), molybdenum (Mo), tungsten (W), tin (Sn), and an alloy thereof, for example.

As described above, since the circuit wiring 120 is configured of only the single metal layer in the printed circuit board 100 according to the exemplary embodiment of the present invention, the circuit wiring 120 may be formed of only the copper foil layer of the copper clad laminate (CCL) provided at the time of manufacturing the printed circuit board. Therefore, the printed circuit board may be manufactured using the copper clad laminate capable of implementing the fine circuit by arbitrarily setting the thickness of the copper foil layer and having the low cost and the excellent thin plate driving force.

Specifically, the thickness of the circuit wiring 120 may be set in a range of 2 μm to 12 μm. As the thickness of the circuit wiring 120 is thinner, it is possible to implement the fine circuit. However, since the copper clad laminate having the thin copper foil layer needs to be used, the manufacturing cost may be increased and the thin plate driving force may be decreased. Unlike this, as the thickness of the circuit wiring 120 is thicker, the manufacturing cost is decreased and the thin plate driving force is increased, but it is difficult to implement the fine circuit.

That is, it is preferable to set the thickness of the circuit wiring 120 in consideration of a trade-off relation between the manufacturing cost and the thin plate driving force, and the fine circuit in the above-mentioned numerical range. However, it is appreciated to those skilled in the art that since the numerical range is a range for limiting an optimal value capable of implementing an effect of the present invention, a numerical range that is slightly out of the above-mentioned numerical range is allowable departing from the object of the present invention.

The via 130, which electrically interconnects the circuit wirings 120 may be formed by an electrolysis plating. Therefore, sidewalls of the via 130 may be provided with a seed layer 131.

The pad layer 140, that is a land formed on a surface of the insulating layer 110 and connected to the end portion of the via 130 in order to stably electrical-interconnect the circuit wirings 120 through the insulating layer, has a predetermined area or more in consideration of an error of an exposure equipment used at the time of forming a circuit, a modification of an used raw material during the process, and the like.

Figure 2:
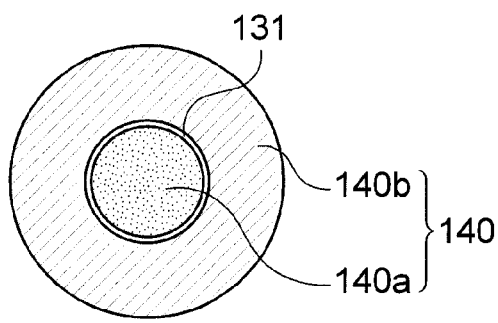
FIG. 2 is a plane view of a pad layer included in the exemplary embodiment of the present invention.

FIG. 2 is a plan view of the pad layer 140 included in the exemplary embodiment of the present invention. The pad layer 140 according to the exemplary embodiment of the present invention is configured of a central portion 140a extended from the via 130 and the outside portion 140b adjacent to the central portion 140a, wherein the outside portion 140b is formed of the same single metal layer as the circuit wiring 120. In addition, the central portion and the outside portion 140b of the pad layer 140 may be formed so as to have the same height.

The shape of the pad layer 140 as described above is formed according to a method for manufacturing the printed circuit board to be described below. Hereinafter, the method for manufacturing the printed circuit board according to the exemplary embodiment of the present invention will be described reference to FIGS. 3 to 9.

Figure 3:
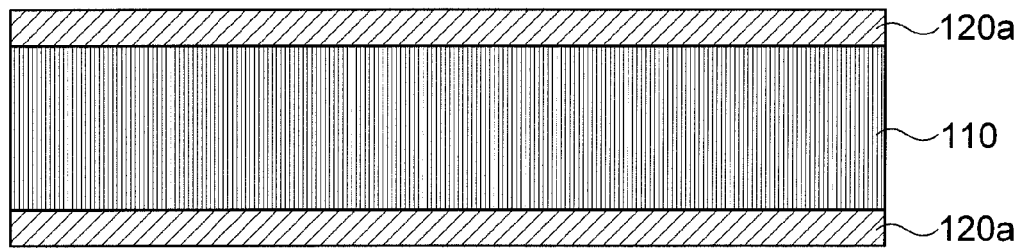
FIGS. 3 to 9 are process views sequentially showing a method for manufacturing the printed circuit board according to the exemplary embodiment of the present invention.

FIGS. 3 to 9 are process views sequentially showing the method for manufacturing the printed circuit board 100 according to the exemplary embodiment of the present invention and the method for manufacturing the printed circuit board 100 according to the exemplary embodiment of the present invention first prepares the insulating layer 110 having a single metal layer 120a adhered to one surface or both surface thereof, as shown in FIG. 3.

In the case in which the single metal layer 120a is made of copper (Cu), the insulating layer 110 to which the single metal layer 120a is adhered becomes the copper clad laminate (CCL). In addition to copper (Cu), the single metal layer 120a may be made of a material selected from the group consisting of aluminum (Al), silver (Ag), palladium (Pd), nickel (Ni), chromium (Cr), molybdenum (Mo), tungsten (W), tin (Sn), and an alloy thereof having the excellent conductivity.

The single metal layer 120a becomes the circuit wiring 120 after a subsequent process and the thickness of the single metal layer 120a is appropriately set in the range of 2 μm to 12 μm in consideration of the manufacturing cost, the thin plate driving force, characteristics for easily implementing the fine circuit, and the like.

Figure 4:
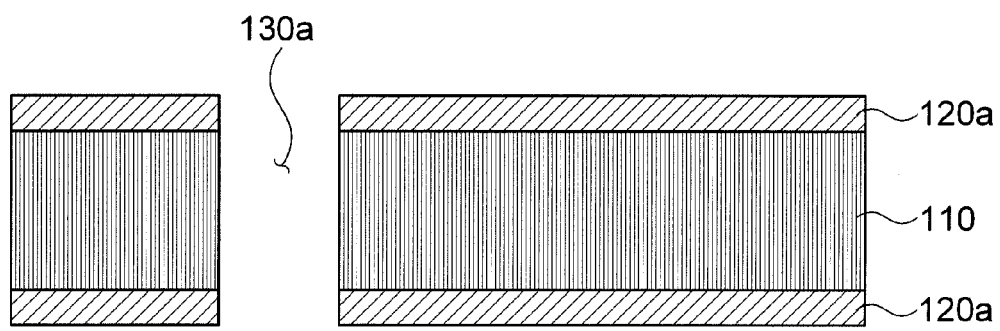

Next, as shown in FIG. 4, a via hole 130a is processed in the insulating layer 110. The via hole 130a may be formed using a mechanical drill using a drill bit. Alternatively, the via hole 130a may be formed by removing a portion in which the via hole 130a will be formed in the single metal layer 120a to form an opening and then removing the insulating layer 110 exposed through the opening by an etching or $CO_2$ laser drill.

Figure 5:
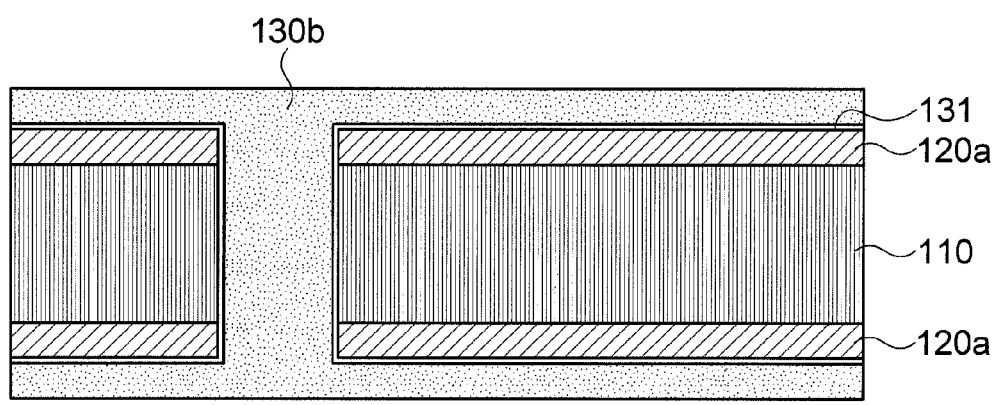

Next, as shown in FIG. 5, a plating layer 130b is formed on a surface of the single metal layer 120a as well as in the via hole 130a.

To this end, a seed layer 131 is first formed on the surface of the single metal layer 120a as well as in the via hole 130a and the electrolysis plating is performed using the seed layer 131 as a leading wire. In this case, the inner portion of the via hole 130a is filled and plated and the plating layer 130b having a predetermined thickness may be formed on the single metal layer 120a.

Figure 6:
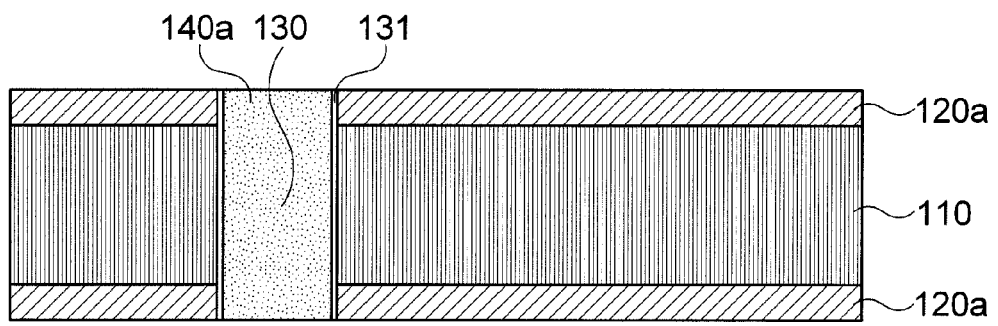

Next, as shown in FIG. 6, a surface of the plating layer 130b is polished so that the surface of the single metal layer 120a is exposed. That is, in order to form the circuit wiring 120 only using the single metal layer 120a, the plating layer having the predetermined thickness formed on the single metal layer 120a is polished. As an example, the above-mentioned process may use a chemical mechanical polishing (CMP) method.

In this case, the seed layer 131 for a pre-processing of the electrolysis plating is also removed by the chemical mechanical polishing (CMP). Alternatively, in the case in which the surface of the plating layer 130b is polished by the chemical mechanical polishing (CMP) and the seed layer 131 is exposed to the outside, the seed layer 131 may be removed by performing flash etching or soft etching.

Through the processes as described above, as shown in FIG. 6, only the single metal layer 120a is left on the upper and lower surfaces of the insulating layer 110 and the via 130 and the central portion 140a of the pad layer extended from the via 130 are formed in the via hole 130a.

As described above, in the case in which the single metal layer 120a is exposed to the outside, finally, the single metal layer 120a is selectively etched, such that the printed circuit board 100 having the circuit wiring 120 and the pad layer 140 formed as shown in FIG. 1 is finally completed.

Figure 7:
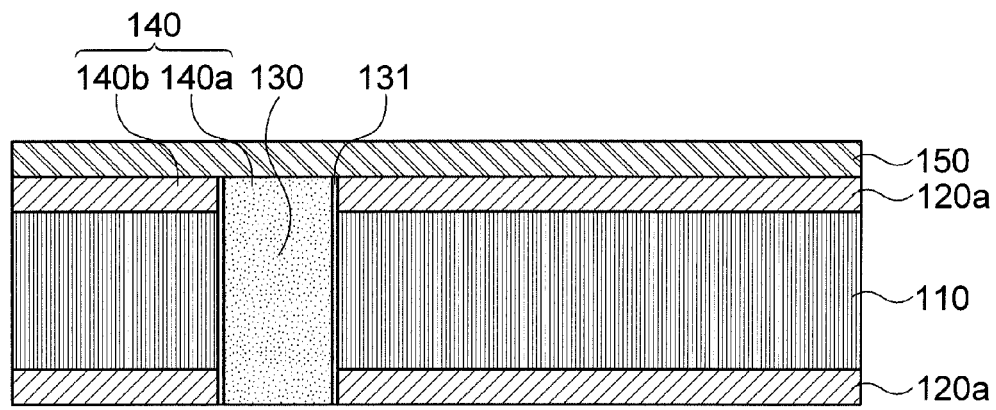
Figure 8:
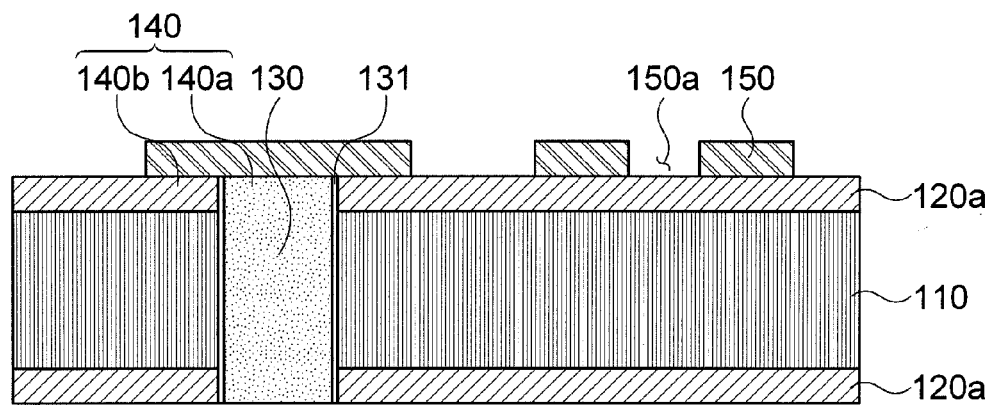
Figure 9:
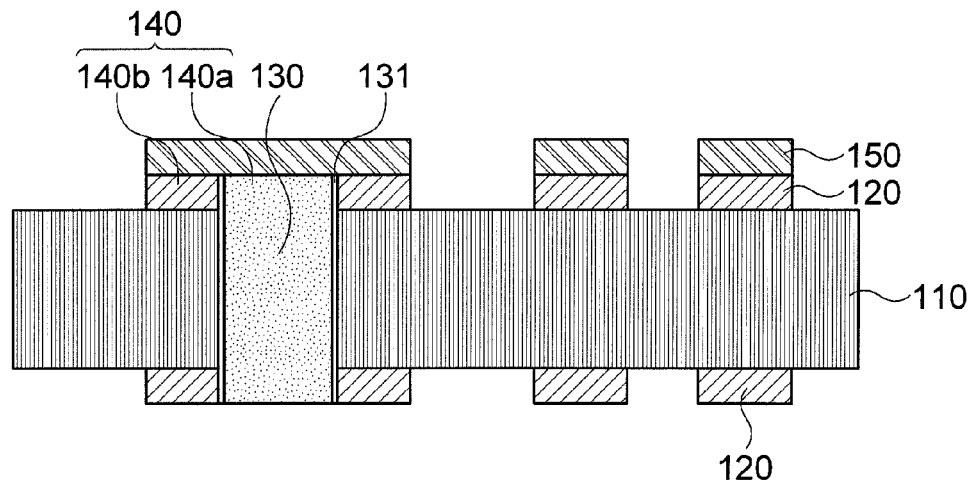

The process of forming the circuit wiring 120 and the pad layer 140 will be described in detail. First, as shown in FIG. 7, a dry film (DF) 150 is adhered to the surface of the single metal layer 120a exposed to the outside. Next, developing is performed by putting an artwork film (not shown) having a predetermined pattern on the dry film 150, irradiating ultra violet (UV) thereon, and then removing an uncured portion (portion in which light is not irradiated) using a developer. As a result, as shown in FIG. 8, an opening part 150a corresponding to the pattern of the circuit wiring 120 is formed in the dry film 150. Next, a portion exposed to the outside through the opening part 150a in the single metal layer 120a is etched so as to form the circuit wiring 120 and the pad layer 140 as shown in FIG. 9, and then finally, the dry film 150 is delaminated using a stripping solution such as NaOH, KOH, or the like.

As described above, since the method for manufacturing the printed circuit board according to the exemplary embodiment of the present invention removes the plating layer of the upper surface of the single metal layer 120a formed by the electrolysis plating for forming the via 130 and then forms the circuit wiring 120 and the pad layer 140 using only the single metal layer 120a, the printed circuit board may be manufactured using the copper clad laminate capable of implementing a fine circuit by appropriately setting the thickness of the copper foil layer and having the low cost and the excellent thin plate driving force.

According to the exemplary embodiment of the present invention, since the circuit wiring is formed only using the copper foil layer of the copper clad laminate provided at the time of manufacturing the printed circuit board, the printed circuit board may be manufactured using the copper clad laminate capable of implementing a fine circuit by adjusting the thickness of the copper foil layer and having the low cost and the excellent thin plate driving force.

The above detailed description has illustrated the present invention. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A printed circuit board, comprising:
   an insulating layer;
   a circuit wiring formed on one surface or both surfaces of the insulating layer and made of a single metal layer;
   a via comprised of a same metal material of circuit wirings formed by an electrolysis plating, and configured to pass through the insulating layer; and
   a pad layer formed on one surface or both surfaces of the insulating layer and adhered to an end portion of the via,
   wherein the pad layer is formed of a central portion extended from the via and an outside portion made of the same single metal layer as the circuit wiring.

2. The printed circuit board according to claim 1, further comprising a seed layer formed on a sidewall of the via.

3. The printed circuit board according to claim 1, wherein the circuit wiring has a thickness of 2 μm to 12 μm.

4. The printed circuit board according to claim 1, wherein a height of the central portion of the pad layer is the same as that of the outside portion of the pad layer.

5. A method for manufacturing a printed circuit board, the method comprising:

(a) preparing an insulating layer having a single metal layer adhered to one surface or both surfaces thereof;
(b) processing a via hole in the insulating layer;
(c) forming a seed layer in the via hole as well as on a surface of the single metal layer and forming a plating layer by an electrolysis plating using the seed layer as a lead wire;
(d) removing the seed layer and the plating layer to expose the surface of the single metal layer; and
(e) selectively etching the single metal layer to form a circuit wiring and a pad layer.

6. The method according to claim 5, wherein step (d) is achieved by a chemical mechanical polishing (CMP) method.

7. The method according to claim 5, wherein the seed layer is removed by flash etching or soft etching.

8. The method according to claim 5, wherein step (e) includes:
adhering a dry film on the surface of the single metal layer exposed to the outside;
forming an opening part in a predetermined position of the dry film;
etching a portion exposed through the opening part in the single metal layer; and
delaminating the dry film.

* * * * *